United States Patent [19]

Blais

[11] Patent Number: 4,658,368

[45] Date of Patent: Apr. 14, 1987

[54] PEAK POSITION DETECTOR

[75] Inventor: François Blais, Vanier, Canada

[73] Assignee: Canadian Patents and Development Limited-Societe Canadienne Des Brevets Et D'Exploitation Limitee, Ottawa, Canada

[21] Appl. No.: 729,138

[22] Filed: Apr. 30, 1985

[51] Int. Cl.[4] .................... H03H 17/00; H03K 5/153
[52] U.S. Cl. .................................. 364/572; 364/724; 307/351
[58] Field of Search ............... 364/572, 575, 577, 723, 364/724, 725; 382/53; 328/150; 307/351, 354; 358/282, 284

[56] References Cited

U.S. PATENT DOCUMENTS

| 4,254,470 | 3/1981 | Jordan | 364/577 |
| 4,262,257 | 4/1981 | Lawrence | 307/351 |
| 4,264,935 | 4/1981 | Lee | 360/45 |
| 4,320,462 | 3/1982 | Lund et al. | 364/525 |
| 4,349,277 | 9/1982 | Mundy et al. | 356/376 |
| 4,525,747 | 6/1985 | Sakai et al. | 382/53 |

OTHER PUBLICATIONS

Brunner, Gerhard, *A Rapid Method for the Measurement of Rapid Peak Shifts*, "Nuclear Measurements and Methods", 185 (1981), pp. 309–312.

Jacobus et al., *Two New Edge Detectors*, "IEEE Transactions on Pattern Analysis and Machine Intelligence", vol. PAMI-3, No. 5, Sep. 1981, pp. 581–592.

Lotto et al., *Automatic Peak-Locating Techniques for γ-Ray Spectra*, "Nuclear Measurements and Methods", 143(1977), pp. 617–620.

Rabiner et al., *Theory and Application of Digital Signal Processing*, Prentice-Hall, Inc., 1975, pp. 28–50.

Tai et al., "A Real Time Correlator with a Peak Detector", *Journal of Electronic Physics*, vol. 8, No. 3, pp. 206–208, Mar. 1975.

*Primary Examiner*—Felix D. Gruber
*Assistant Examiner*—Daniel W. Juffernbruch

[57] ABSTRACT

The position of a peak in a digital signal is determined by a circuit consisting of a finite impulse response filter constructed in accordance with either the expression $(1+z^{-1})(1+z^{-2})(1+z^{-5})$ or the simplified expression $(1+z^{-1})(1-z^{-3})$, where z is the z transform function and the index indicates the number of clock intervals in each delay. The practical realization of the filter for applying these expressions to the input signal involves the use of three (for the first expression) or two (for the second expression) delay circuits in series. The output of the filter is a differentiated signal, the zero crossing point of which represents the desired peak position. This crossing point is detected in an interpolation circuit which linearly interpolates the location of such point to a fraction of a clock interval or pixel.

12 Claims, 3 Drawing Figures 4,658,368

PEAK POSITION DETECTOR

BACKGROUND OF THE INVENTION

The present invention relates to a peak position detector for electrical signals.

In electrical signal processing there are many instances when it is important to be able to detect and accurately measure the exact position of a peak in an electrical signal. For example, a correlation process produces an output having a peak at a position related to the phase difference of its inputs.

Another application for an accurate peak position detector is in the area of image processing. For example, high precision, active range finding techniques used in robotic vision systems are principally based on the triangulation principle, with either a linear array of detectors or a bi-dimensional CCD detector (charge coupled device), i.e. a video camera, converting the optical data into electrical signals. See, for example, U.S. patent applications of M. Rioux Ser. No. 509,373 filed June 30, 1983, abandoned in favour of Ser. No. 819,477 and entitled "Three diminsional imaging device" now U.S. Pat. No. 4,627,734.

PRIOR ART

Because of their simplicity, analog methods of peak position detection have been attractive in the past. Examples of such methods are disclosed in U.S. Pat. Nos. 3,178,595 issued Apr. 13, 1965 to R. H. Cole; 3,569,843 issued Mar. 9, 1971 to F. C. Meyer; 3,891,930 issued June 24, 1975 to E. O. V. Petrusson; and 4,262,257 issued Apr. 14, 1981 to C. E. Lawrence. However, because of problems of noise and shielding, component stability and accuracy, filter non-linearity in both amplitude and phase, and calibration, these techniques are difficult to use and are not as versatile as digital methods.

Digital methods have the advantage of being very robust by reason of having a better noise immunity and a very high stability. Adjustment is minimal over a large frequency range. On the other hand, the size and cost of digital systems has generally been higher and the maximum working speed limited by the technology used and by the complexity of the electronic circuit.

Proposals for digital methods have been put forward by C. J. Jacobus and R. T. Chien in a paper "Two new edge detectors" published in IEEE Transactions on pattern analysis and machine intelligence, Vol. Pam 1-3 No. 5 September 1981 pages 581-592; and in U.S. Pat. Nos. 4,254,470 issued Mar. 3, 1981 to J. R. Jordan and 4,320,462 issued Mar. 16, 1982 to R. E. Lund et al.

Jacobus et al and Lund both employ the centre of mass method. Jordan uses several reference values and averages the central position when the signal peak crosses the reference value. This is an indirect method and is similar to the centre of mass method.

Another method similar to the centre of mass method is proposed by I. Tai et al in a paper entitled "A real time correlation with a peak detector" published in Journal of Electronic Physics Vol. 8 No. 3, pages 206-208, March 1975.

There is also the "curve fit" method, as exemplified by the papers of I. de Lotto et al entitled "Automatic peak-locating techniques for X-ray spectra" published in Nuclear Instruments and Methods 143 (1977) by North Holland Publishing Co., pages 617-620, and G. Brunner entitled "A rapid method for the measurement of small peak shifts" published in Nuclear Instruments and Methods 185 (1981) by North Holland Publishing Co., pages 309-312.

SUMMARY OF THE INVENTION

The object of the present invention is to provide a simplified (relative to all the prior proposals), but nevertheless accurate, peak position detector that will give in real time the position of a peak in a digital input signal to a precision better than one pixel.

To this end, in one form the invention makes use of the z transform to apply the operator [1 1 1 1 0-1-1-1-1] to the input signal and thereby generate a differentiated signal, the zero crossing point of which defines the desired peak position.

By use of the z transform, the above operator can be shown to be equivalent to the expression $(1+z^{-1})(1+z^{-2})(1-z^{-5})$, where $z^{-1}$ represents a delay of one clock interval in time (one pixel in space), $z^{-2}$ the same for two clock intervals, and so on.

Alternatively, a simplified operator [1 1 0-1-1] can be used, which is equivalent to the expression $(1+z^{-1})(1-z^{-3})$.

A practical realisation of the first of these expressions will consist of a circuit for detecting the position of a peak of a digital input signal, comprising a finite impulse response filter having an input connected to receive the input signal and an output, and an interpolation circuit connected to said output for detecting a point when such output crosses zero, including means for linearly interpolating the location of such point to a fraction of a clock interval, such point representing the desired peak position. This filter will comprise a series connection in any sequence of three delay circuits. A first of these delay circuits will comprise a delay for generating a signal delayed by one clock interval and an adder for adding such delayed signal to the undelayed signal received by this first circuit. The second of the delay circuits will comprise a delay for generating a signal delayed by two clock intervals and an adder for adding such twice delayed signal to the undelayed signal received by this second circuit, and the third of the delay circuits will comprise a delay for generating a signal delayed by five clock intervals and a subtracter for subtracting such five times delayed signal from the undelayed signal received by this third circuit.

For the simplified expression, the filter will comprise a series connection in either sequence of only two delay circuits. A first of these delay circuits will comprise a delay for generating a signal delayed by one clock interval and an adder for adding such delayed signal to the undelayed signal received by this first circuit, and the second of the delay circuits will comprise a delay for generating a signal delayed by three clock intervals and a subtracter for subtracting such thrice delayed signal from the undelayed signal received by this second circuit

DETAILED DESCRIPTION OF THE PREFERRED EMBODIMENTS

Figure 1:
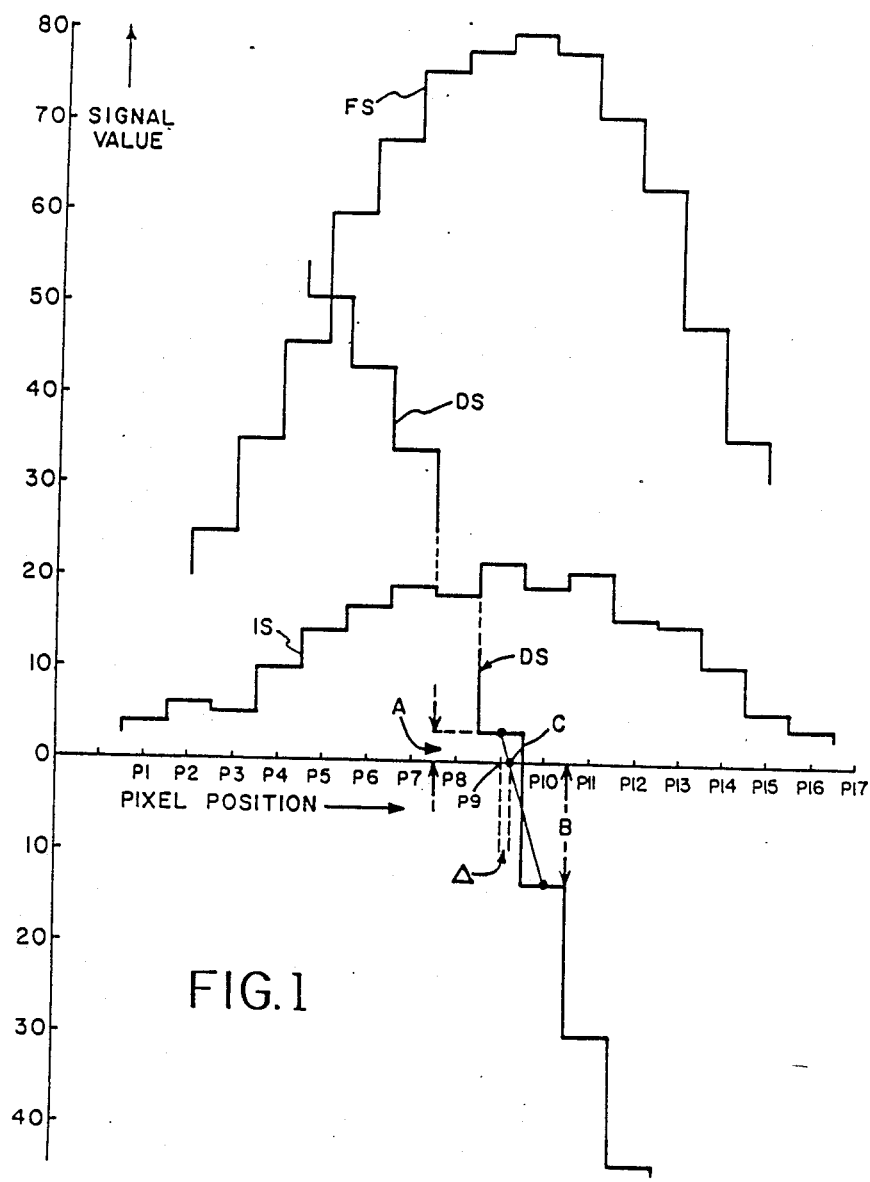
FIG. 1 is a graphical representation of the manner of functioning of the first embodiment of the invention.

Let it be assumed that a detector (uni- or bi-dimensional) has sixteen pixels designated P1 to P16 and let it further be assumed that a digital signal from this detector, referred to as the input signal IS, has, for the respective pixels, the amplitude values set out numerically in Table 1 below and graphically in FIG. 1.

TABLE 1

| Pixel No. | IS | FS | DS |
|---|---|---|---|
| P1 | 4 | | |
| P2 | 6 | | |
| | | 25 | |
| P3 | 5 | | |
| | | 35 | |
| P4 | 10 | | |
| | | 46 | |
| P5 | 14 | | 51 |
| | | 60 | |
| P6 | 17 | | 43 |
| | | 68 | |
| P7 | 19 | | 34 |
| | | 76 | |
| P8 | 18 | | 18 |
| | | 78 | |
| P9 | 22 | | 3 |
| | | 80 | |
| P10 | 19 | | −13 |
| | | 78 | |
| P11 | 21 | | −30 |
| | | 71 | |
| P12 | 16 | | −44 |
| | | 63 | |
| P13 | 15 | | |
| | | 48 | |
| P14 | 11 | | |
| | | 36 | |
| P15 | 6 | | |
| P16 | 4 | | |

To obtain a filtered signal FS these values of the signal IS are summed with the operator [1 1 1 1], that is to say the first four values are each multiplied by one and then summed. Since the first four values are 4, 6, 5 and 10, the first sum is 25, and this result is shown at the average location of the first four pixels, i.e. between pixels P2 and P3, which can be considered pixel P2.5. Summing the second, third, fourth and fifth values yields a total of 35, and so on, which process generates the values listed in Table 1 and shown in FIG. 1. It will be seen that the filtered signal FS demonstrates that the peak lies somewhere between pixels P9 and P10.

To obtain a differentiated signal DS, either the IS values are summed with the operator [1 1 1 1 0 -1 -1 -1 -1] or the FS values are summed with the operator [1 0 0 0 0 -1]. The same result is obtained whichever procedure is adopted. For example, applying the first of these operators to the IS values for pixels P1 to P9 (beginning at the right hand end of the operator in the usual way) yields −4, −6, −5, −10, 0, +17, +19, +18 and +22, namely 51, while applying the second operator to the FS values from between pixel P2.5 to P7.5 yields −25+76 which again equals 51. The series of DS values calculated in this way is listed in Table 1 and shown in FIG. 1, and it will be seen that the curve crosses zero at the peak, i.e. between pixels P9 and P10. Assuming that linear interpolation is valid, the exact crossing point C, and hence the exact location of the peak, is given by the expression $$\Delta = \frac{A}{A - B}$$

where $\Delta$ is the pixel fraction and A and B are the DS values each side of the crossing point, i.e. $A \geq 0$ and $B < 0$. In the example given, $A = 3$ and $B = -13$, so $\Delta = 3/16$ or 0.1875. Hence the peak of the input signal IS occurs at a time equivalent to the theoretical pixel location of approximately P9.2.

The operators referred to above for manipulating the sequence can be represented using the z transform. Given a sequence h(n), defined for $n \geq 0$, its z transform is defined as $$H(z) = \sum_{n=0}^{\infty} h(n) z^{-n}$$

where z is a complex variable.

Assuming h(n) is nonzero only in the interval $N1 \leq n \leq N2 (N1 < N2)$ where N1 and N2 are finite, then H(z) converges everywhere in the z plane except possibly $z = 0$ or $\infty$. If a finite duration sequence is the impulse response of an LTI (linear time invariant) causal system, the system is called a "finite impulse response" or FIR system or, equivalently, an FIR filter.

The foregoing basic explanation is taken from the book entitled "Theory and Application of Digital Signal Processing" by Lawrence R. Rabiner and Bernard Gold, published by Prentice-Hall Inc., Englewood Cliffs, N.J., 1975, Chapters 2 and 3, namely pages 9 through 186.

More specifically, the operator [1 1 1 1 0 -1 -1 -1 -1] which yields the differentiated signal DS can be rewritten, using the z transform, as: $1 + z^{-1} + z^{-2} + z^{-3} - z^{-5} - z^{-6} - z^{-7} - z^{-8}$. This expression equals $(1 + z^{-1})(1 + z^{-2})(1 - z^{-5})$ which provides a compact and relatively easily built physical structure, where $z^{-1}$ represents a delay of one clock interval, $z^{-2}$ a delay of two such intervals and $z^{-5}$ a delay of five intervals.

The filtered signal FS can also be obtained directly by the operator $(1 + z^{-1})(1 + z^{-2})$, i.e. operator [1 1 1 1] which is the same as the operator used in Table 1.

Figure 2:
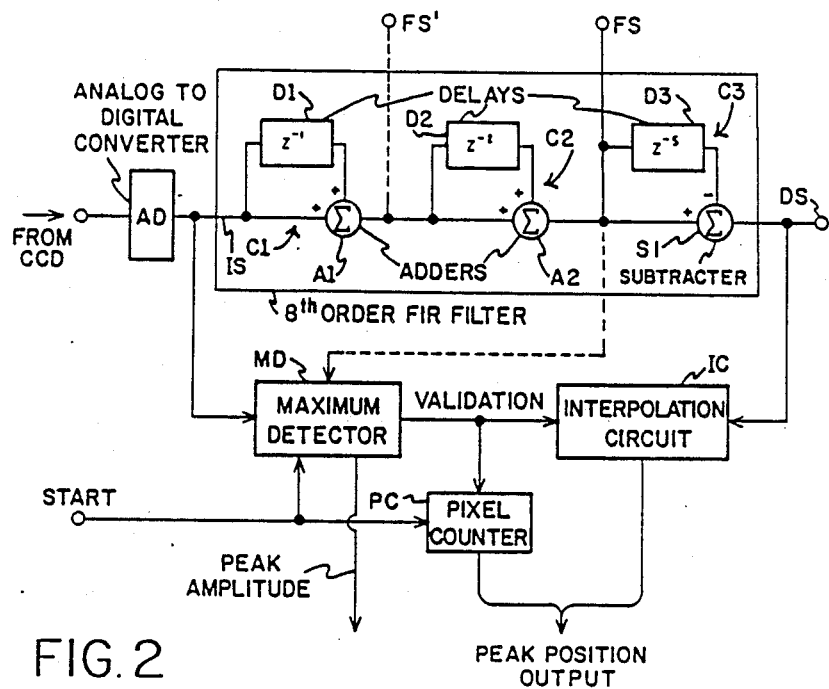
FIG. 2 is a circuit diagram of this first embodiment.

FIG. 2 shows a physical arrangement in which the input signal IS received through an analog to digital converter AD from a CCD (charge coupled device) is supplied to a first delay circuit C1 having an adder A1 where the signal IS is summed with its own value one interval earlier as generated in a delay D1. The output of the circuit C1, i.e. of the adder A1, is then passed to a second delay circuit C2 consisting of a second adder A2 and a second delay D2 the output of which is the value of the output from the circuit C1 two intervals earlier. The output of the circuit C2 is the filtered signal FS. This output is passed to a third delay circuit C3 consisting of a subtracter S1 and a third delay D3 the output of which is the value of the output of the circuit C2 five intervals later. This delayed output is subtracted from the input to circuit C3. The output of the subtracter S1 is the differentiated signal DS which passes to a zero crossing detecting and interpolation circuit IC for noting such crossing and solving for $\Delta$ in accordance with the equation above.

The zero crossing is validated by a maximum detector MD which receives the input signal IS and determines that a peak did in fact occur. The output of the interpolation circuit IC i.e. a six bit fraction of the pixel position, is concaternated to the pixel number derived from a pixel counter PC to provide a peak position output. In FIG. 1 and Table 1 the zero crossing position has been shown aligned in time (and pixel position) with the signal peak, in order to simplify understanding of the operation. In reality, the signal DS will be delayed five intervals, i.e. the zero crossing would actually be detected at pixel position of approximately P14.2. To compensate for this delay, when the operation is begun by a trigger pulse on a START terminal connected to the maximum detector MD, the pixel counter PC is set to $-P5$. The final peak position output then shows the correct value of P9.2. As shown in FIG. 2, the maximum detector can also be used to furnish an output giving the amplitude of the peak.

As shown in broken lines in FIG. 2, instead of being connected to the input signal IS, the maximum detector MD can be connected to receive the filtered signal FS (allowing for a delay of 2½ pixels in the signal FS not shown in FIG. 1 or Table 1). FIG. 2 also shows in broken lines a further possible filtered output signal FS' from circuit C1, representing the operator [1 1].

That the output signal DS obtained in FIG. 2 in fact corresponds with that calculated in Table 1 can be demonstrated as follows. Applying the expression $1+z^{-1}$ achieved in circuit C1 to the values of the input signal IS in Table 1 would require the addition of first the values for P1 and P2, then the values for P2 and P3 and so on, giving the series 10, 11, 15, 24, 31, 36, 37, 40 etc. Taking this output of the circuit C1 and applying to it the expression $1+z^{-2}$ of the circuit C2, is achieved by adding together alternate elements of the foregoing series, i.e. $10+15=25$; $11+24=35$ and so on, yielding a further series 25, 35, 46, 60, 76, 78 etc., which will be seen to be the series shown for FS in Table 1. Finally, taking this output of the circuit C2 and applying to it the expression $1-z^{-5}$ of circuit C3 by subtracting from each value the value five intervals earlier, i.e. $76-25=51$; $78-35=43$, yields the series 51, 43, 34 etc. shown at DS in Table 1.

The circuits C1 to C3 thus constitute an 8th order, finite impulse response, asymmetrical, digital filter. Moreover, the same final output DS will be obtained regardless of the sequence in which the circuits C1-C3 are arranged. On the other hand, the output FS will, of course, change with the order of the circuits. For example, if circuits C1 and C2 are interchanged to use the sequence C2, C1, C3, the output FS will not change but the output FS' will represent the operator [1 0 1]. If the circuit C3 is placed first in the sequence, no filtered signal output is obtained.

Figure 3:
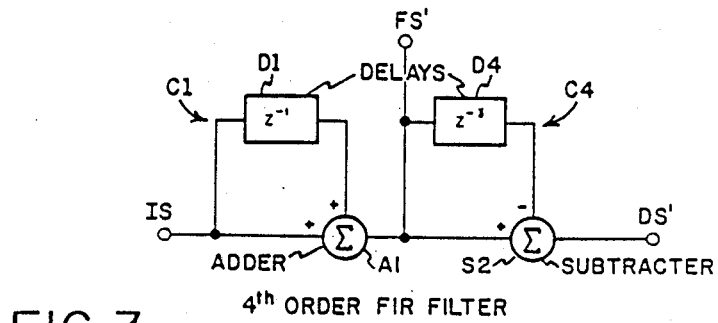
FIG. 3 is a circuit diagram of the alternative embodiment.

As an alternative, a simplified 4th order F1R filter can be used, as shown in FIG. 3. Circuit C1 is the same as in FIG. 2. Its output is passed to a circuit C4 consisting of a subtracter S2 and a delay D4 which provides the subtracter S2 with $-z^{-3}$, i.e. the value of such output three intervals earlier. The output of the subtracter S2 is a differentiated signal DS'. This filter functions in accordance with the expression $(1+z^{-1})(1-z^{-3})$ which is equivalent to the operator [1 1 0 -1 -1] which is a shortened version of the operator [1 1 1 1 0 -1 -1 -1 -1] used with the 8th order filter of FIG. 2.

If the values for FS in Table 1 (the output of the circuit C1) have applied to them the expression $1-z^{-3}$, the result is a series 14, 20, 21, 13, 9, 5, 3, $-3$, $-10$, $-14$ etc. The values 3 and $-3$ correspond in position to pixels P9 and P10 respectively, and hence in this instance the interpolation circuit would give the peak position as P9.5 (the pixel counter will now be started at $-P3$).

Again, the order of the circuits can be changed, i.e. C4, C1 instead of C1, C4, provided the signal FS' can be dispensed with.

If the input signal IS is substantially noise free, the arrangements of FIGS. 2 and 3 both provide a high degree of accuracy, i.e. to a resolution of 1/64th of a pixel. On the other hand, for a very noisy signal IS, such as that illustrated in FIG. 1, the results of FIGS. 2 and 3 will differ, as demonstrated above, and the resolution will be more of the order of a quarter to a half of a pixel. It can be shown that, for a noisy signal, if the peak is relatively long, i.e. has a standard deviation of more than about two pixels, the filter of FIG. 2 provides a more accurate peak position, while for a short peak (less than two pixels standard deviation), the filter of FIG. 3 gives better results.

What is claimed is:

1. A circuit for detecting the position of a peak of a digital input signal, comprising
   (a) a finite impulse response filter having an input connected to receive the input signal and an output, and
   (b) an interpolation circuit connected to said output for detecting a point when such output crosses zero, including means for linearly interpolating the location of such point to a fraction of a clock interval, such point representing the desired peak position,
   (c) wherein said filter comprises a series connection in any sequence of three delay circuits,
   (d) a first of said delay circuits comprising a delay for generating a signal delayed by one clock interval and an adder for adding such delayed signal to the undelayed signal received by this first circuit,
   (e) a second of said delay circuits comprising a delay for generating a signal delayed by two clock intervals and an adder for adding such twice delayed signal to the undelayed signal received by this second circuit, and
   (f) the third of said delay circuits comprising a delay for generating a signal delayed by five clock intervals and a subtracter for subtracting such five-times delayed signal from the undelayed signal received by this third circuit.

2. A circuit according to claim 1, including a maximum detector connected to receive the input signal and to provide an output representing the amplitude of the peak.

3. A circuit according to claim 2, including a pixel counter connected to the output of the interpolation circuit including means for compensating for a delay of five clock intervals in the filter for representing the peak position in terms of its actual pixel position including a fraction thereof.

4. A circuit according to claim 1, wherein the third delay circuit is arranged last in said sequence, the output of either one of said first and second delay circuits providing a filtered version of the input signal.

5. A circuit according to claim 4, including a maximum detector connected to receive a said filtered version of the input signal and to provide an output representing the amplitude of the peak.

6. A circuit according to claim 5, including a pixel counter connected to the output of the interpolation circuit including means for compensating for a delay of five clock intervals in the filter for representing the peak position in terms of its actual pixel position including a fraction thereof.

7. A circuit for detecting the position of a peak of a digital input signal, comprising
  (a) a finite impulse response filter having an input connected to receive the input signal and an output, and
  (b) an interpolation circuit connected to said output for detecting a point when such output crosses zero, including means for linearly interpolating the location of such point to a fraction of a clock interval, such point representing the desired peak position,
  (c) wherein said filter comprises a series connection in either sequence of two delay circuits,
  (d) a first of said delay circuits comprising a delay for generating a signal delayed by one clock interval and an adder for adding such delayed signal to the undelayed signal received by this first circuit, and
  (e) the second of said delay circuits comprising a delay for generating a signal delayed by three clock intervals and a subtracter for subtracting such thrice delayed signal from the undelayed signal received by this second circuit.

8. A circuit according to claim 7, including a maximum detector connected to receive the input signal and to provide an output representing the amplitude of the peak.

9. A circuit according to claim 8, including a pixel counter connected to the output of the interpolation circuit including means for compensating for a delay of three clock intervals in the filter for representing the peak position in terms of its actual pixel position including a fraction thereof.

10. A circuit according to claim 7, wherein said second delay circuit is arranged second in the sequence, the output of the first delay circuit providing a filtered version of the input signal.

11. A circuit according to claim 10, including a maximum detector connected to receive said filtered version of the input signal and to provide, an output representing the amplitude of the peak.

12. A circuit according to claim 11, including a pixel counter connected to the output of the interpolation circuit including means for compensating for a delay of three clock intervals in the filter for representing the peak position in terms of its actual pixel position including a fraction thereof.

* * * * *